United States Patent
Chang

(10) Patent No.: US 6,419,984 B1
(45) Date of Patent: Jul. 16, 2002

(54) LOW PRESSURE CHEMICAL VAPOR DEPOSITION WITH REDUCED PARTICULATE CONTAMINATION

(75) Inventor: Hui-Hua Chang, Hsin-Cui (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 1147 days.

(21) Appl. No.: 08/512,033

(22) Filed: Aug. 7, 1995

(51) Int. Cl.$^7$ ............................................. C23C 16/00
(52) U.S. Cl. ............................. 427/248.1; 427/255.17; 427/255.28; 427/255.37; 427/255.393; 427/255.394
(58) Field of Search ........................ 427/255.2, 255.1, 427/255, 248.1, 255.17, 255.28, 255.37, 255.393, 255.394

(56) References Cited

U.S. PATENT DOCUMENTS

| | | | | |
|---|---|---|---|---|
| 4,395,438 A | * | 7/1983 | Chiang | 427/94 |
| 4,957,777 A | * | 9/1990 | Ilderem et al. | 427/55 |
| 5,250,323 A | * | 10/1993 | Miyazaki | 427/255.1 |
| 5,433,784 A | * | 7/1995 | Miyagi et al. | 118/715 |
| 5,498,292 A | * | 3/1996 | Ozaki | 118/724 |
| 5,517,943 A | * | 5/1996 | Takahashi | 118/715 |

FOREIGN PATENT DOCUMENTS

JP   2-107775   * 4/1990

OTHER PUBLICATIONS

IBM Technical Disclosure Bulletin, vol. 32, No. 3B, Aug. 1989 "Hot Process Tube", pp. 302–303.*
S.Wolf and R. N. Tauber in Silicon Processing for the VLSI Era, vol. 1, p. 169, (1986), Lattice Press (Sunset Beach, California).

* cited by examiner

*Primary Examiner*—Shrive P. Beck
(74) *Attorney, Agent, or Firm*—George O. Saile; Stephen B. Ackerman

(57) ABSTRACT

Several modifications have been made to the LPCVD equipment of the prior art in order to reduce the amount of particulate contamination. A bypass vent has been added in parallel with the main vacuum exhaust gate valve. Said bypass vent is left open during loading and unloading of the system with wafers that are to be processed, thereby ensuring a steady flow of air away from them at all times. Additionally, the section of the vacuum line immediately adjacent to the reaction chamber is heated. An example of the application of said modified equipment to LPCVD is provided as well as test results that illustrate the efficacy of the new equipment and method.

6 Claims, 2 Drawing Sheets

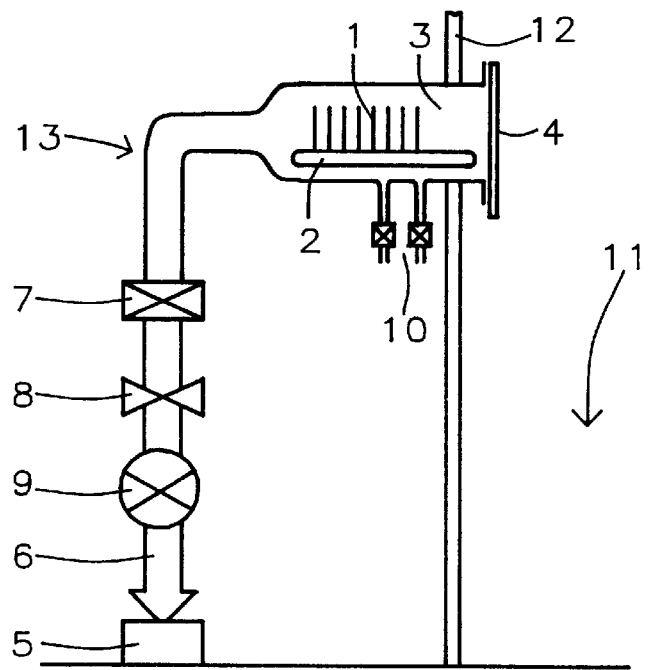
FIG. 1 – Prior Art
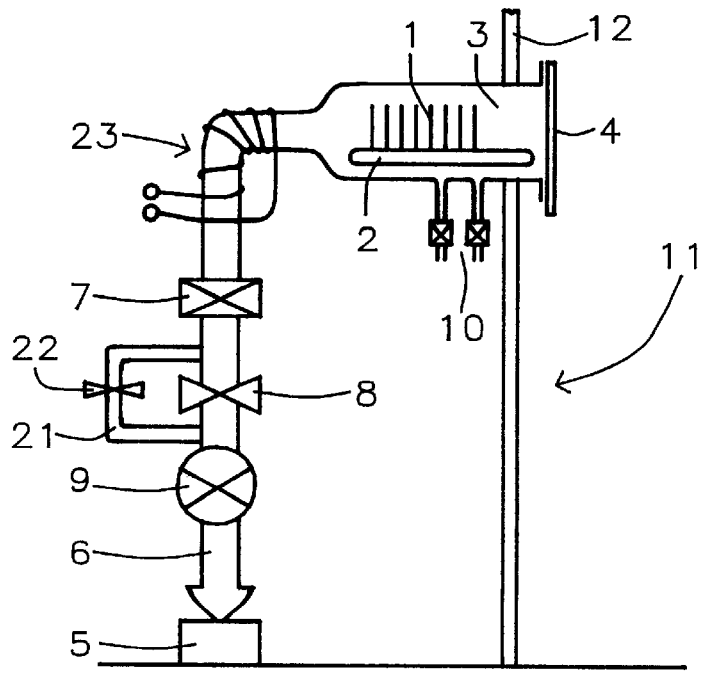
FIG. 2

LOW PRESSURE CHEMICAL VAPOR DEPOSITION WITH REDUCED PARTICULATE CONTAMINATION

BACKGROUND OF THE INVENTION (1) Field of the Invention

The invention relates to the general field of chemical vapor deposition, more particularly to the problem of reducing particulate contamination.

(2) Description of the Prior Art

FIG. 1 is a schematic representation of an apparatus for performing low pressure chemical vapor deposition (LPCVD), typical of the type used in the manufacture of integrated circuits. Semiconductor wafers 1 are stacked in quartz boat 2 and placed inside heated reaction chamber 3 which is then sealed by securing end plate 4. Reactive gas may be admitted to the chamber through inlet valves 10. The other end of the reaction chamber is connected to a vacuum system comprising a pump 5, vacuum line 6 (which extends from the pump to the reaction chamber), trap 7, gate valve 8, and automatic pressure control valve 9.

In order to maintain the highest possible level of cleanliness, particularly in relation to dust particles of all sorts, the semiconductor wafers are prepared for the LCVD operation in clean room 11, separated from the pumping system by barrier 12. Despite these precautions, one of the disadvantages associated with LCVD has been reported to be ' susceptibility to particulate contamination'. See, for example, S. Wolf and R. N. Tauber in Silicon Processing for the VLSI Era, vol. 1, page 169. This susceptibility to contamination exists despite the presence of trap 7 whose purpose is to filter out any contaminant matter that might flow back from the pump into reaction chamber 3.

For example, during the deposition of silicon oxide from the decomposition of tetra ethyl ortho silicate ($Si(OC_2H_5)_4$), only about 40% of the reactants are decomposed in the heating chamber, the remaining 60% being pumped out into the vacuum line. As a result, a goodly fraction of the reaction byproducts end up being deposited there and can be fed back into the main reaction chamber despite the presence of trap 7.

We are not aware of any prior art that addresses this specific problem, i.e. particulate contamination that is specifically associated with the LPCVD process.

SUMMARY OF THE INVENTION

It is therefore and object of the present invention to provide a process for performing LPCVD that results in essentially no contamination from particulate matter.

A further object of the present invention is provide the apparatus with which to achieve the first object.

Yet another object of the present invention is to provide both a method and an apparatus, for performing LPCVD with essentially no contamination from particulate matter, that add little or nothing to the costs associated with performing LPCVD under the current art.

These objects have been achieved through several modifications to the LPCVD equipment of the prior art. A bypass vent has been added in parallel with the main vacuum exhaust gate valve. Said bypass vent is left open during loading and unloading of the system with wafers that are to be processed, thereby ensuring a steady flow of air away from them at all times. Additionally, the section of the vacuum line immediately adjacent to the reaction chamber is heated.

BRIEF DESCRIPTION OF THE DRAWINGS

FIG. 1 depicts an apparatus of the type associated with the prior art for use in LPCVD.

FIG. 2 depicts an apparatus of the type associated with the present invention for use in LPCVD.

DESCRIPTION OF THE PREFERRED EMBODIMENTS

Figure 3:
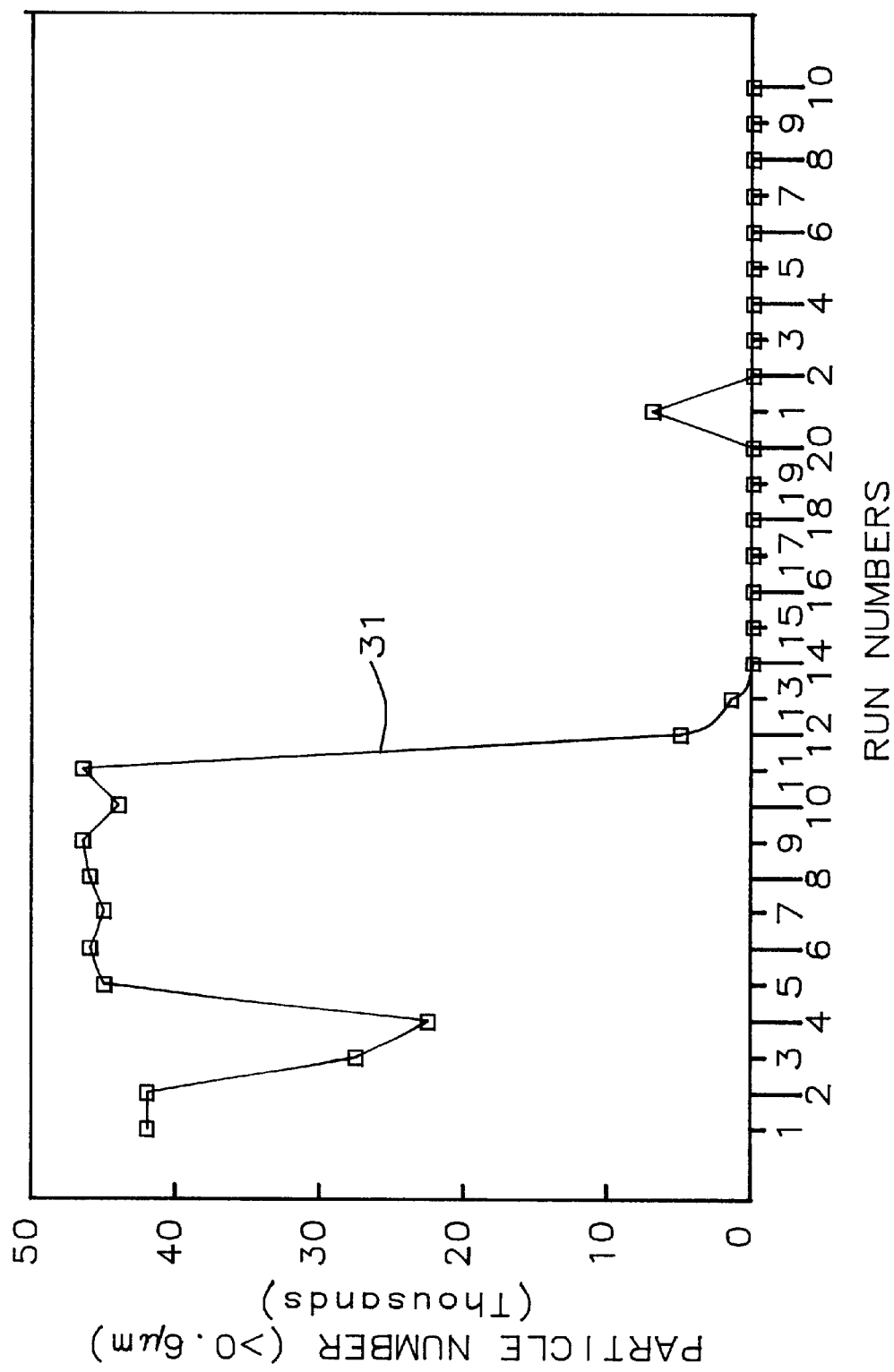
FIG. 3 is a curve showing the contaminant particle count for several LPCVD runs based on the prior art and on the present invention.

Referring once again to FIG. 1, it can be seen that the semiconductor wafers 1 that lie in boat 2 have been stacked vertically. This arrangement has the obvious advantage that many more wafers can be introduced into reaction chamber 3 than if they were laid down flat. Such an arrangement could not be used in a system intended for Atmospheric Pressure CVD (APCVD), for example, as the thickness of the deposited layer would be very non-uniform. This is not the case with LPCVD, which is one of its major advantages, particularly in manufacturing where maximum throughput per CVD run is of great importance.

It will also be seen (in FIG. 1) that, between them, the boat 2 and the semiconductor wafers 1 fill much of the cross-section of reaction chamber 3. Thus, when a boat filled with wafers is either loaded into, or removed from, the reaction chamber, it acts like a piston sliding inside a cylinder, pushing air ahead of itself or withdrawing air behind itself. We have determined that this flow of air, particularly that associated with the withdrawal of the boat from the chamber, is a major cause of particulate contamination, said contaminating particles originating in region 13 of the vacuum line and being the byproducts or unreacted components of the original reaction.

Referring now to FIG. 2, we show the modifications that we have made to the apparatus of the prior art (as exemplified in FIG. 1) in order to prevent the particulate contamination problem associated with the withdrawal of the wafer bearing boat from the reaction chamber. A second vacuum line 21 has been added. It is connected at one end to first vacuum line 6 between pressure control valve 9 and gate valve 8. Vacuum line 21 is connected at its other end to vacuum line 6 between gate valve 8 and trap 7. Second vacuum line 21 also has its own gate valve 22, as shown. Thus, vacuum line 21 acts as a vent for bypassing gate 8 whenever so desired. Its purpose is to be able to maintain a gentle, but steady, flow of air in a direction away from the semiconductor wafers while they are being withdrawn from the reaction chamber. Accordingly, the flow impedance of the bypass vent is such that, When gate valve 22 is open, gas flows through it at a rate between about 10,000 and 15,000 sccm.

Another feature of the present invention is the addition of means 23 (in FIG. 2) for heating the primary vacuum line in the section close to reaction chamber 3. Heating means 23 is capable of raising the temperature on the inside wall of the vacuum line to between about 140 and 180° C. This helps to reduce, or eliminate, the condensation of the byproducts or unreacted components on said wall.

As in the prior art, reactive gases whose decomposition results in the coating of the semiconductor wafers in the reaction chamber, may be admitted through inlet valves 10. We have successfully used the following gases to deposit the following layers in the apparatus depicted in FIG. 2:

a mixture of ammonia ($NH_3$) and dichlorosilane ($SiH_2Cl_2$) for the deposition of silicon nitride ($Si_xN_y$)

tetra ethyl ortho silicate (TEOS) (Si(OC$_2$H$_5$)$_4$) for the deposition of silicon oxide and silane (SiH$_4$) for the deposition of polycrystalline silicon.

It should be noted, however, that application of the apparatus of the present invention to LPCVD is not limited to these reactive gases or deposited layers.

We will now describe a typical sequence of steps that would be followed in the application of the above-described apparatus to LPCVD. Continuing our reference to FIG. 2, with end plate 4 removed, pump 5 operating, gate valve 8 closed and bypass valve 22 open, boat 2, loaded with semiconductor wafers (usually, but not necessarily, silicon wafers), is inserted into reaction chamber 3. The chamber is now sealed by the attachment of end plate 3 and gate valve 8 is opened so that evacuation of chamber 3 begins. The wafers within chamber 3 are then heated to the desired reaction temperature (means for heating not shown).

The gas or gases whose decomposition under the conditions of temperature and pressure prevailing within chamber 3 will lead to the deposition of the desired material onto wafers 1, are now admitted through inlet valves 10. Pressure inside chamber 3 is controlled through adjustment of automatic pressure control valve 6. When the desired layer thickness has been achieved, deposition of material is terminated by closing inlet valves 10 as well as by ceasing to heat wafers 1.

Evacuation of chamber 3 continues for about 30 minutes to ensure that it is substantially free of reactant gas and power is always applied to heating means 23 so as to heat the inside of the vacuum line in order to prevent the condensation of byproducts. Gate valve 8 is now closed and air is admitted to the system until chamber 3 is in pressure equilibrium with the atmosphere. End plate 4 is now removed and bypass valve 22 is then opened. Wafer bearing boat 2 is now removed from chamber 3 and the process is complete.

In order to confirm that the above described apparatus and method do, in fact, substantially reduce the amount of particulate contamination encountered during LPCVD, we measured (by a sampling technique) the number of contaminant particles per wafer present after some 30 LPCVD runs for the deposition of silicon oxide from TEOS. Runs 1 through 11 were performed using the apparatus and method of the prior art. Runs 12 through 30 were performed using the apparatus and methods of the present invention.

The results of these measurements are summarised in FIG. 3, specifically in curve 31, which plots the number of particles (in thousands) seen in each run. As the curve shows, using the apparatus and method of the prior art, resulted in particle counts in the range of from 25,000 to 45,000, whereas the particle counts for runs based on the apparatus and methods of the present invention were typically less than about 50 particles per wafer.

While the invention has been particularly shown and described with reference to the preferred embodiments thereof, it will be understood by those skilled in the art that various changes in form and details may be made without departing from the spirit and scope of the invention.

What is claimed is:

1. A method for performing Low Pressure Chemical Vapor Deposition onto a substrate, comprising the sequential steps of:

providing a heated reaction chamber, including a source of reactive gases and a pumping system controlled through a gate valve;

providing an end plate for sealing said reaction chamber;

providing an openable bypass vent for said gate valve;

opening said bypass vent, thereby causing air to flow from the reaction chamber to the pumping system;

inserting the substrate into said chamber;

closing the bypass vent;

then sealing said reaction chamber with said end plate;

opening said gate valve, thereby causing said chamber to be evacuated;

admitting said reactive gas to the chamber, thereby causing the reaction products of the decomposition of said reactive gas to deposit as a layer on said substrate;

heating the section of the pumping system that is closest to the reaction chamber;

terminating the admission of the reactive gas;

continuing to evacuate the reaction chamber until the reactive gas has been substantially removed from the reaction chamber;

then closing said gate valve and admitting air into the reaction chamber until it is in equilibrium with the atmosphere;

removing said end plate;

opening said bypass vent, thereby causing a stream of air to flow from the reaction chamber towards the pumping system; and removing the substrate from the reaction chamber.

2. The method of claim 1 wherein said substrate comprises silicon, said deposited layer comprises silicon nitride, and said reactive gas comprises a mixture of ammonia and dichlorosilane.

3. The method of claim 1 wherein said substrate comprises silicon, said deposited layer comprises silicon oxide, and said reactive gas comprises tetra ethyl orthosilicate.

4. The method of claim 1 wherein said substrate comprises silicon, said deposited layer comprises polycrystalline silicon, and said reactive gas comprises silane.

5. The method of claim 1 wherein the temperature to which said section of the pumping system that is closest to the reaction chamber is heated is between about 140 and 180° C.

6. The method of claim 1 wherein the rate of gas flow through said bypass vent is between about 10,000 and 15,000 sccm.

* * * * *